United States Patent
Kravitz

(10) Patent No.: US 7,804,932 B2
(45) Date of Patent: Sep. 28, 2010

(54) DOUBLE-FEEDBACK FLEXIBLE NON-INTEGER FREQUENCY DIVISION CIRCUIT

(75) Inventor: Lior Kravitz, Kfar Bilu (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/254,000

(22) Filed: Oct. 19, 2008

(65) Prior Publication Data

US 2010/0097106 A1 Apr. 22, 2010

(51) Int. Cl.
*H03K 21/00* (2006.01)
*H03B 19/00* (2006.01)

(52) U.S. Cl. .................. 377/48; 327/115; 327/117; 377/47

(58) Field of Classification Search ......... 327/113–115, 327/117, 118; 377/47, 48
See application file for complete search history.

(56) References Cited

U.S. PATENT DOCUMENTS

| | | | | |
|---|---|---|---|---|
| 4,670,674 A * | 6/1987 | Kantorowicz et al. | ........ | 327/118 |
| 6,087,865 A * | 7/2000 | Bradley | ................. | 327/117 |
| 6,665,368 B2 * | 12/2003 | Sahm | .................. | 377/47 |
| 6,816,021 B2 * | 11/2004 | Hahn et al. | ............... | 331/74 |
| 2008/0164916 A1 * | 7/2008 | Petrovic et al. | ........... | 327/117 |
| 2009/0027091 A1 * | 1/2009 | Yamaguchi et al. | ........ | 327/118 |

* cited by examiner

*Primary Examiner*—Lincoln Donovan
*Assistant Examiner*—Patrick O'Neill
(74) *Attorney, Agent, or Firm*—Cool Patent, P.C.; Kenneth J. Cool

(57) ABSTRACT

An embodiment of this invention combines feed-forward and feedback frequency division circuits in a such a way, to provide greater flexibility in choosing the non-integer division ratios at the output, with little added complexity. Alternate embodiments include additional divider(s) in signal or feedback paths providing additional flexibility and design simplification. An embodiment uses in-phase/quadrature signals to select the desired modes at feedback-path and signal-path mixers. Various alternatives are also described.

20 Claims, 5 Drawing Sheets

PRIOR ART

DOUBLE-FEEDBACK FLEXIBLE NON-INTEGER FREQUENCY DIVISION CIRCUIT

BACKGROUND OF THE INVENTION

One of the architectures of choice in the current state of the art in modern communication transceivers is Zero Intermediate Frequency (Zero-IF) architecture. Several of the drawbacks of this architecture can be minimized when the voltage controlled oscillator (VCO) is running at a non-integer ratio of the input/output frequency. This in turn requires a non-integer frequency division. Two current prior art approaches to non-integer division circuits are (a) feed-forward (118, 114) and (b) regenerative (148, 144), as illustrated in FIGS. 1(a) and 1(b), respectively.

Both circuits have been in use for decades, but they are somewhat limited in their applications. The resulting division ratio at the output (124, 154) is $$\frac{N \pm 1}{N}$$

and $$\frac{M}{M \pm 1}$$

for the feed-forward and the regenerative versions, respectively. The only degree of freedom, other than the divider (118 or 148), is whether the upper sideband or the lower sideband of the mixing operation is selected (either by filtering or by implementing an image-rejection mixer). The feed-forward circuit (100) has been somewhat enhanced in prior art by adding another divider (186), as illustrated in FIG. 1(c). In fact, the configuration in FIG. 1(a) is the special case of the configuration in FIG. 1(c), where P=1. This additional degree of freedom improves the flexibility of the circuit, such that the resulting division ratio at output (184) becomes $$\frac{N \pm P}{N \cdot P};$$

however, this circuit is limited to fractions less than one, as both N and P are positive integers.

In fact, many ratios cannot be reached at all with current designs, without cascading circuits, wasting both power and area. Another disadvantage of cascading circuits is the spurious low frequency emissions generated, that will require filtering.

One of the embodiments of the present invention avoids the drawbacks in prior art designs in the range of non-integer ratios achievable, and it avoids cascading circuit drawbacks, such as wasting power/area or generating low frequency spurious emission.

frequency ratio configuration.

DETAILED DESCRIPTION OF THE PREFERRED EMBODIMENTS

Figure 2:
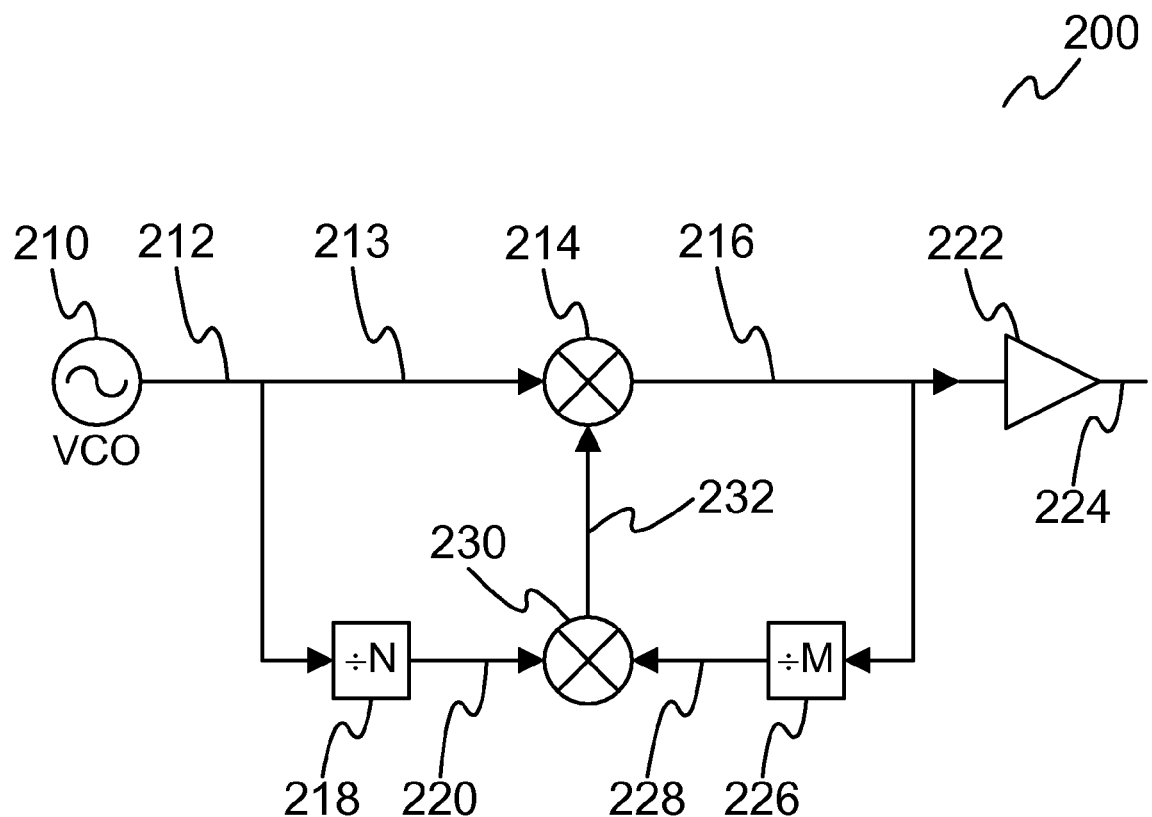
FIG. 2 illustrates a novel double-feedback frequency division circuit, comprising of Feed-Forward and Feedback loops.

An embodiment of this invention (200) combines feed-forward and feedback frequency division circuits in an innovative way, to provide greater flexibility in choosing the division ratio with little added complexity and often with only a minor area and power penalty. This double-feedback embodiment implements both the feed-forward (218) and the feedback (226) integer divider loops having integer dividers in the same circuit, for example, via a feedback-path mixer (230) and a signal-path mixer (214), as shown in FIG. 2.

Note that the depiction of this embodiment shows the VCO source (210) and an optional output buffer amplifier (222), which are also depicted in current prior art designs (110, 140, 170, 122, 152, and 182). However, other signal sources may be used, instead of a VCO, and other circuitry or loads may be employed at the output, instead of a buffer amplifier.

The source signal frequency $f_i$ feeds to feed-forward divider N (218) and signal-path mixer (214). The frequency at the output (220) of feed-forward divider is $$\frac{f_i}{N}.$$

The output (216, 224) frequencies denoted by $f_o$ feed into the feedback divider M (226), whose output (228) has frequencies $$\frac{f_o}{M}$$

and subsequently feeds into the feedback-path mixer (228).

The output (232) of the feedback-path mixer has frequencies $$\left(\frac{f_i}{N} \pm \frac{f_o}{M}\right)$$

and it feeds to the signal-path mixer (214). The output (216) of the signal-path mixer becomes $$\left(\frac{f_i}{N} \pm \frac{f_o}{M}\right) \pm f_i.$$

Equating the signal-path mixer output frequencies to $f_o$ yields the frequency ratio expression:

$$f_i \cdot \left(1 \pm \frac{1}{N}\right) = f_o \cdot \left(1 \pm \frac{1}{M}\right) \quad (1)$$

$$f_o = f_i \cdot \left(\frac{N \pm 1}{N}\right) \cdot \left(\frac{M}{M \pm 1}\right) \quad (2)$$

The resulting frequency division ratio in equation (2) enables two degrees of freedom, in addition to other attributes such as upper side band (USB) or lower side band (LSB) mode selection for each mixer.

Note that any variation or expansions of this double-feedback frequency divider embodiment with feed-forward and feedback divider loops is also considered part of this invention.

Figure 3:
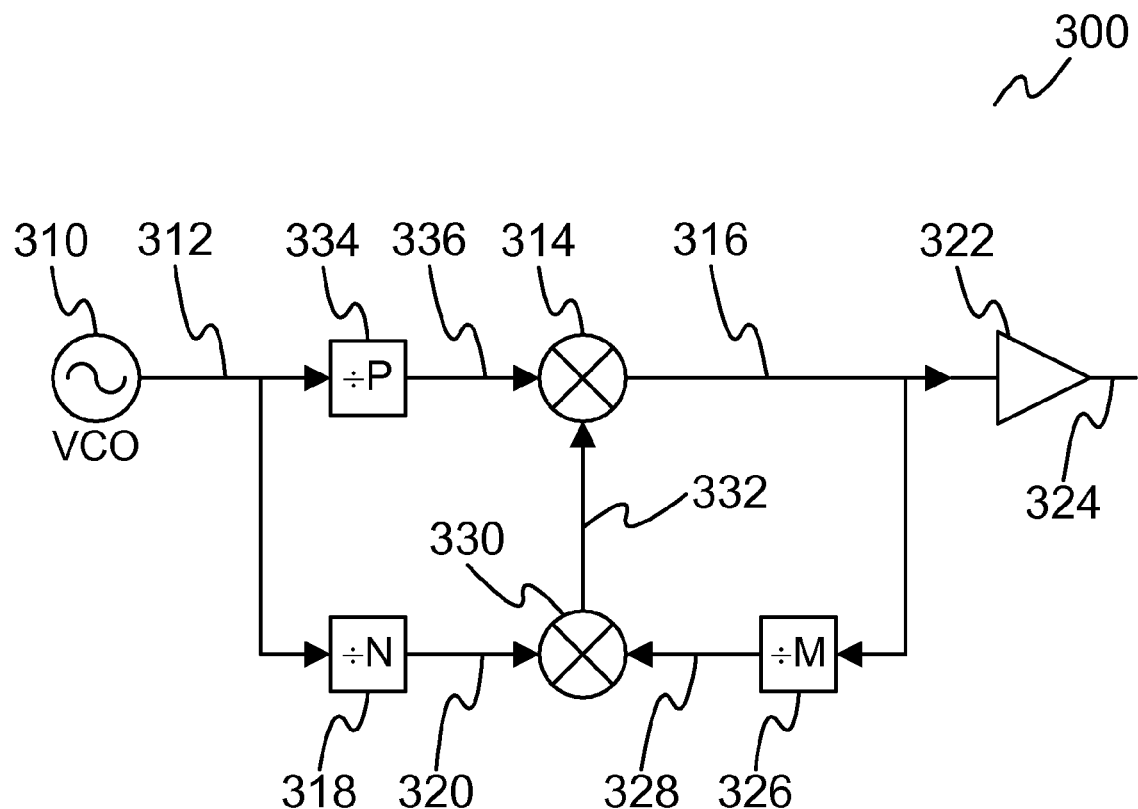
FIG. 3 illustrates a novel double-feedback frequency division circuit, comprising of Feed-Forward and Feedback loops with additional divider in the main signal path.

For example, an embodiment of this invention (300), as depicted in FIG. 3, adds a divider (by P) (334) at the main signal path (213) before the signal-path mixer (314), while keeping the feed-forward divider (318), feedback divider (326), feedback-path mixer (330) and signal-path mixer (314). Logically, this is equivalent to having the input frequency $f_i$ divided by P and modifying N in feed-forward divider (318) to N/P, while applying equation (2), as if the P divider (334) is relocated outside the feed-forward loop at input path (212 or 312) closer to the input signal source (310). Therefore, the output frequency ratio for this configuration is:

$$f_o = \left(\frac{f_i}{P}\right) \cdot \left(\frac{\frac{N}{P} \pm 1}{\frac{N}{P}}\right) \cdot \left(\frac{M}{M \pm 1}\right) = f_i \cdot \left(\frac{N \pm P}{N \cdot P}\right) \cdot \left(\frac{M}{M \pm 1}\right) \quad (3)$$

This embodiment provides an extra degree of freedom (having 3 parameters M, N, and P) to tailor the output frequency ratio.

Figure 4:
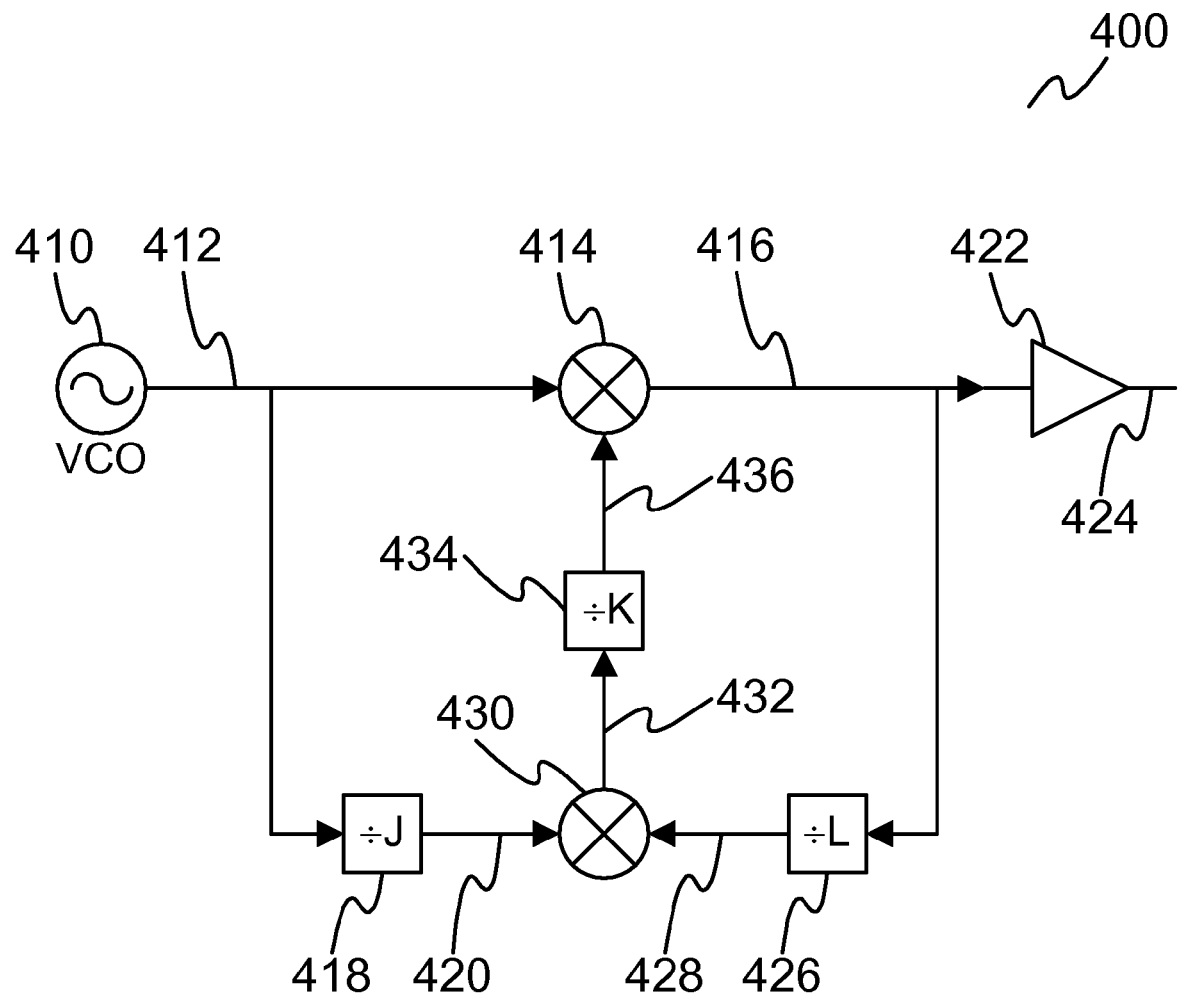
FIG. 4 illustrates a novel double-feedback frequency division circuit, comprising of Feed-Forward and Feedback loops with a common divider.

An embodiment of this invention uses an additional divider (by K) (434) between feedback-path mixer (430) and signal-path mixer (414), as illustrated in FIG. 4, while maintaining the feed forward and feedback loops with feed forward divider (divide by J) (418) and feedback divider (divide by L) (426). The K divider (434) divides the output (432) frequencies of the feedback-path mixer (430) which in turn adds/subtracts the output (420 and 428) frequencies of feed forward (418) and feedback (426) dividers. Logically, for output (416, 424) frequency ratio, this is equivalent to applying equation (2) with M=K·L and N=K·J, as if shortening/removing K divider (434) between the mixers and pushing the division by K to both the feed forward and feedback dividers.

$$f_o = f_i \cdot \left(\frac{K \cdot J \pm 1}{K \cdot J}\right) \cdot \left(\frac{K \cdot L}{K \cdot L \pm 1}\right) = f_i \cdot \frac{N \pm 1}{N} \cdot \left(\frac{M}{M \pm 1}\right) \quad (4)$$

where $M = K \cdot L$ and $N = K \cdot J$.

Therefore, when in a configuration, such as depicted in FIG. 2, M and N have a common factor (e.g., K), the same output frequency ratio is obtained by combining the common factor to a single divider (434) after the feedback-path mixer (430) while reducing the dividing factors for the feed forward divider and feedback divider from N and M to J and L, respectively. In an embodiment of this invention, such reduction yields an overall area/power saving by simplifying the dividers.

Figure 5:
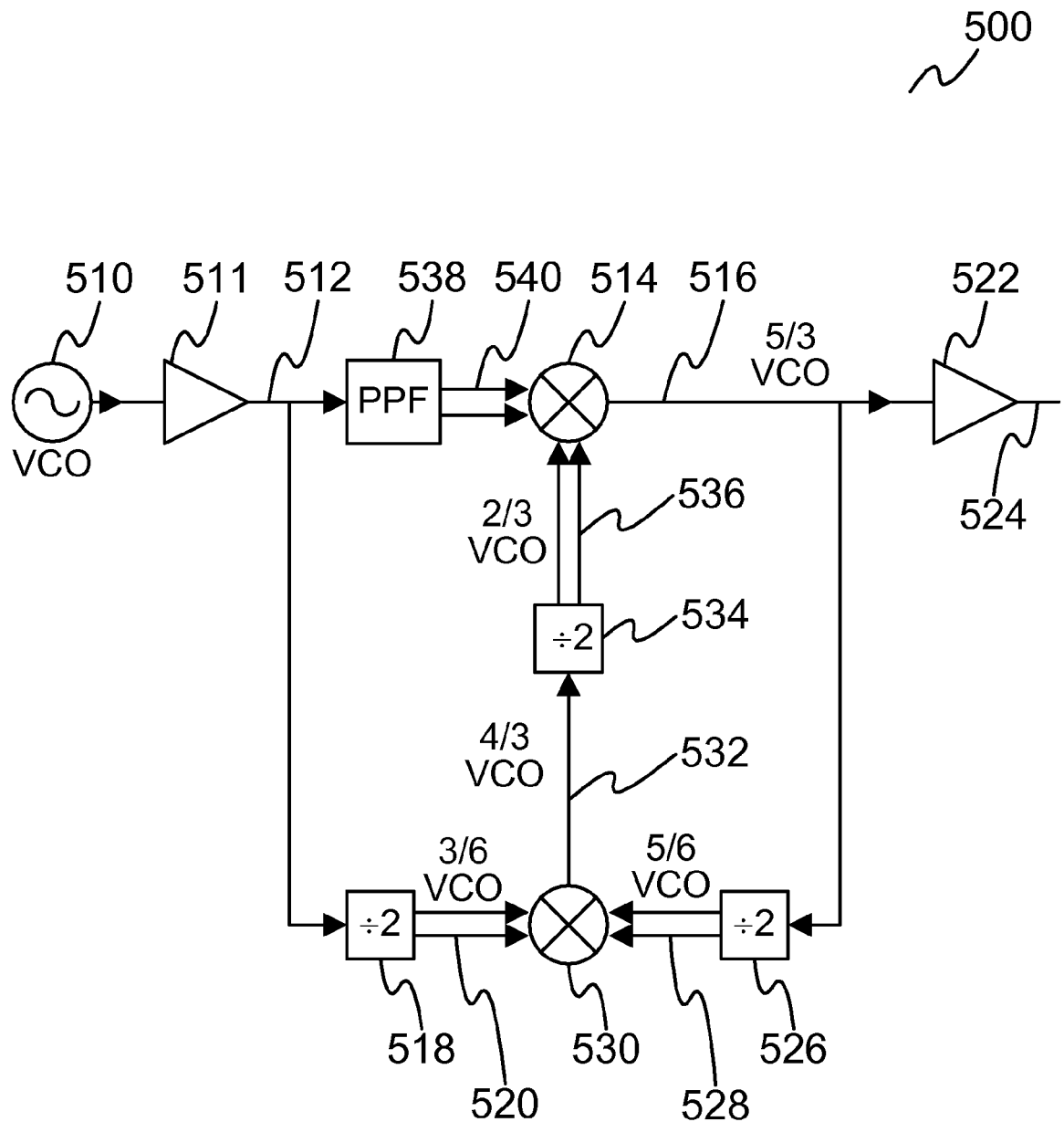
FIG. 5 illustrates a novel double-feedback frequency division circuit, comprising of Feed-Forward and Feedback loops with a common divider in a $$\frac{5}{3}$$

In an embodiment of this invention, e.g., as depicted in FIG. 5 (500), where some or all of the division ratios are even, divide-by-2 circuits are used (e.g., 518, 526, or 534) to generate quadrature (in-phase and 90° phase) signals as the last stage of each division cascade (e.g., 520, 528, or 536). In one embodiment, these dividers are used to drive image-rejection mixers (e.g., in 530 or 514), which can save much of the filtering, required in order to select the desired solution at mixer outputs (532, 516) and the main output (524).

An example of such an embodiment is a 5/3 frequency multiplier (500), as illustrated in FIG. 5. In this implementation, a division ratio which is difficult to achieve by existing methods is reached, while maintaining image-rejection and spurious emission to a minimum, through the use of quadrature divide-by-2 circuits (518, 526, and 534) and one polyphase filter (538). With (K=J=L=2), then (M=N=4), and based on equation (4), the output frequencies ratios are 3/5 and 5/3. Through image rejection, the embodiment rejects the output frequency ratio 3/5, while outputting output frequency ratio of 5/3. The image rejection enables mode selection (i.e., between USB and LSB) at the output of the mixer.

An implementation of this novel Feedback/Feed Forward 5/3 frequency division circuit was simulated in a Cadence environment using TSMC® 90 nm devices. The sub-circuits used were all taken from existing designs made by the PTK Radio Frequency Integrated Circuits (RFIC) design team; however, the sub-circuits were not optimized for current consumption, spurious response, or other parameters, and were only tweaked to demonstrate the actual division ratio.

For the simulation, each of the three dividers (518, 526, and 534) comprises of two Current Mode Logic (CML) flip-flops (with tail supply), connected in feedback configuration to provide frequency divide-by-2 with quadrature outputs. The feedback-path and signal-path mixers were each comprised of two AC-coupled Gilbert cell image rejection mixers. The feedback-path mixer was biased through a resistive load, while the signal-path mixer was biased through an LC tank, for better filtering. Table 1 summarizes some of the simulated frequency content at the output.

TABLE 1

Simulated output frequency content

| Frequency (GHz) | Frequency Ratio | 20 dBV$_{p-p}$ |
| --- | --- | --- |
| 1.4 | 1/3 f$_i$ | −75 |
| 4.2 (= f$_i$) | 3/3 f$_i$ | −55 |
| 7.0 (= f$_o$) | 5/3 f$_i$ | −13 |
| 9.8 | 7/3 f$_i$ | −56 |
| 8.4 | 2 f$_i$ | −104 |
| 14 | 2 f$_o$ | −99 |

The simulated circuit output (with an input of 4.2 GHz) converged very quickly (~7 ns) to a 7 GHz output (=5/3×4.2 GHz) with almost $0.5V_{pk-pk}$ differential amplitude. The spurious response, as expected (see FIG. 5, item 536), was mainly spaced 2/3 of the input frequency, and the highest spur at any other spacing was 90 dBc below the main signal (except for the 2nd harmonic, which was ~4 dB higher). The closest spurious signals were 42 dBc lower than the main signal, and were fairly distant from the desired output signal, which would then be easily filtered. Note that the simulated circuit was not optimized, and its performance could probably be improved significantly.

Figure 1A:
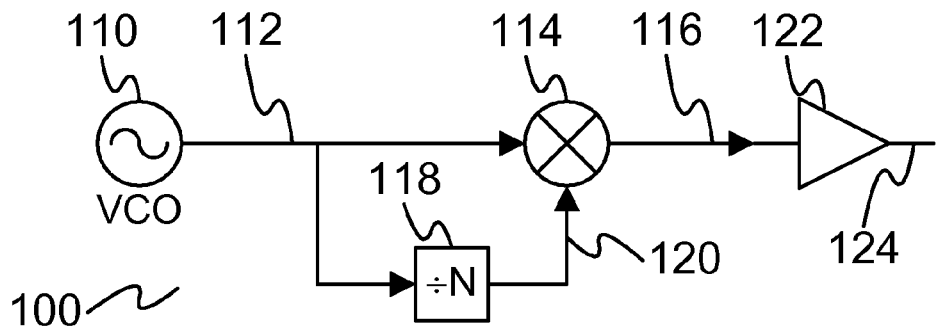
FIG. 1(a) illustrates prior art non-integer frequency division via Feed-Forward mechanism; (b) illustrates prior art non-integer frequency division via Regenerative mechanism; and (c) illustrates prior art non-integer frequency division via Feed-Forward mechanism with additional divider in-line with input feed.
Figure 1B:
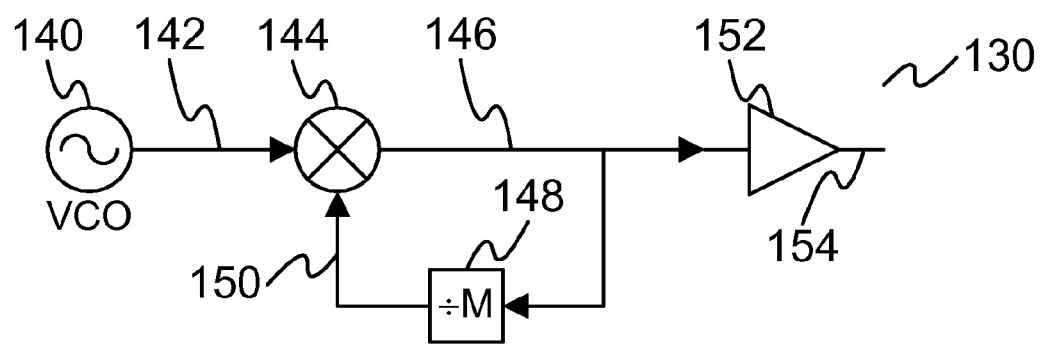
Figure 1C:
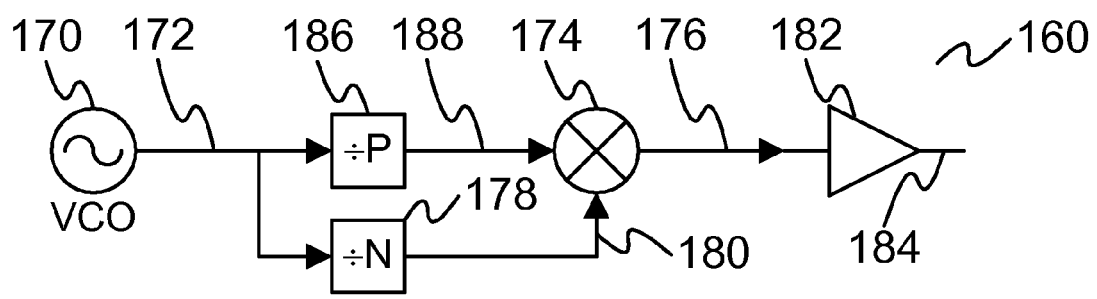

An embodiment of this invention provides much greater range of possible division ratios available for design over existing art. Many of these ratios cannot be practicably achieved with current designs without cascading circuits, wasting both power and area. The output frequency ratio in an embodiment of this invention, e.g., the 5/3 division ratio shown in FIG. 5, can also be achieved by cascading a 5/4 feed-forward circuit (e.g., FIG. 1(*a*); N=4) after a 4/3 regenerative one (e.g., FIG. 1(*b*); M=4), but in such a combination that the lowest spurious emissions frequency generated in both cascaded circuits is 1/3 of the VCO frequency (e.g., at 120 and 150), instead of 2/3 of the VCO frequency, as in an embodiment of the invention (e.g., FIG. 2, 232, for M=N=4; or FIG. 5, 536, for J=L=K=2). Avoiding low intermediate frequency emissions provides additional benefit in terms of coexistence, filtering requirements (e.g. power and area), and the ability to more efficiently meet regulatory requirements in the final product.

An embodiment of the double feedback frequency divider invention may be implemented in variety of ways.

For example, in order to select desired solution at the output of mixers (based on USB/LSB) in mode selection, an embodiment of this invention may use any one or more of the following or their equivalents:

Image Rejecting Mixer;
Bandpass filter with a tuned tank;
Highpass or Lowpass filter with passive or active components; or
any combination of the above.

For example, in order to generate in-phase/quadrature (IQ) signals (for most Image Rejection Mixers), an embodiment of this invention may use any one or more of the following or their equivalents:

divide-by-2 block, where a division ratio is even;
Poly-Phase Filter (PPF);
Delay-Locked Loop (DLL); or
90° Hybrid splitter.

For example, an embodiment of this invention may use any one or more of the following mixer implementations or their equivalents:

Gilbert Cell mixers;
Passive Transistor-based mixers;
Passive Diode-based mixers; or
any other mixer implementation.

For example, an embodiment of this invention may use any one or more of the following divider implementations or their equivalents:

Differential or single-ended; or
CML, CMOS or pure digital design.

The embodiments of this invention may be used in variety of systems and applications, such as in transceivers requiring non-harmonic relation between the VCO frequency and the input/output frequency, wireless systems and products, such as, WiFi or WiMAX (or combined) products, or any other signal processing systems or products. The embodiments of this invention provide more flexibility in frequency planning and system/chip design, such as in power/area savings and the reduction of spurious low frequency emissions. Given this broader range of implementation possibilities, an embodiment of this invention provides more options in choosing VCO frequencies to minimize interference, or provides for the dual-use of the same VCO for multiple transmit/receive bands.

Any variations of the above teachings are also intended to be covered by this patent application.

The invention claimed is:

1. A system for non-integer frequency division, said system comprising:
   a first mixer including a first input that is connected to an input signal source through a first path, a second input, and a first output;
   a second mixer including a third input, a fourth input, and a second output that is connected to said second input through a second path;
   a feed-forward integer divider connected between said input signal source and said third input; and
   a feedback integer divider connected between said first output and said fourth input.

2. A system as recited in claim 1, said system further comprising a common-factor divider placed in said second path, between said second mixer and said first mixer;
   wherein said second output of said second mixer feeds into said common-factor divider; and
   wherein an output of said common factor divider feeds into said second input of said first mixer.

3. A system as recited in claim 2, wherein a first sideband mode is selected at said second output of said second mixer, and a second sideband mode is selected at said first output of said first mixer.

4. A system as recited in claim 3, wherein said first sideband mode and said second sideband mode are selected based on one or more of the following techniques: image rejection or frequency filtering.

5. A system as recited in claim 2, said system further comprising an in-phase-quadrature generator placed in said first path, before said first mixer;
   wherein an output of said in-phase-quadrature generator feeds into said first input of said first mixer.

6. A system as recited in claim 2, said system further comprising a poly-phase filter placed in said first path, before said first mixer;
   wherein an output of said poly-phase filter feeds into said first input of said first mixer.

7. A system as recited in claim 6, wherein said output of said poly-phase filter, an output of said feed-forward integer divider to said third input of said second mixer, or an output of said feedback integer divider to said fourth input of said second mixer includes an in-phase signal line and a quadrature signal line.

8. A system as recited in claim 2, wherein said output of said common-factor divider, an output of said feed-forward integer divider to said third input of said second mixer, or an output of said feedback integer divider to said fourth input of said second mixer includes an in-phase signal line and a quadrature signal line.

9. A system as recited in claim 1, said system further comprising a main-signal-path integer divider placed in said first path, between said input signal source and said first mixer;
   wherein said input signal source feeds into said main-signal-path integer divider; and wherein an output of said main-signal-path integer divider feeds into said first input of said first mixer, through a portion of said first path.

10. A system as recited in claim 9, wherein a first sideband mode is selected at said second output of said second mixer, and a second sideband mode is selected at said first output of said first mixer.

11. A system as recited in claim 10, wherein said first sideband mode and said second sideband mode are selected based on one or more of the following techniques: image rejection or frequency filtering.

12. A system as recited in claim 1, wherein a first sideband mode is selected at said second output of said second mixer, and a second sideband mode is selected at said first output of said first mixer.

13. A system as recited in claim 12, wherein said first sideband mode and said second sideband mode are selected based on one or more of the following techniques: image rejection or frequency filtering.

14. A system as recited in claim 1, said system further comprising an in-phase-quadrature generator placed in said first path, before said first mixer;
wherein an output of said in-phase-quadrature generator feeds into said first input of said first mixer.

15. A system as recited in claim 14, wherein said in-phase-quadrature generator comprises one or more of the following: poly-phase filter, delay-locked loop, or 90° hybrid splitter.

16. A system as recited in claim 1, wherein an output of said feed-forward integer divider to said third input of said second mixer, or an output of said feedback integer divider to said fourth input of said second mixer includes an in-phase signal line and a quadrature signal line.

17. A system as recited in claim 1, wherein said feed-forward integer divider or said feedback integer divider is an even divider; and
wherein said even divider comprises of a divide-by-two divider.

18. A system as recited in claim 17, wherein an output of said even divider to said second mixer includes an in-phase signal line and a quadrature signal line.

19. A system for non-integer frequency division, said system comprising:
an input signal source;
a first mixer including a first input that is connected to said input signal source through a first path, a second input, and a first output at a first sideband mode;
a second mixer including a third input, a fourth input, and a second output at a second sideband mode that is connected to said second input through a second path;
a feed-forward integer divider connected between said input signal source and said third input; and
a feedback integer divider connected between said first output and said fourth input.

20. A system as recited in claim 19, wherein said input signal source is an oscillator.

* * * * *

UNITED STATES PATENT AND TRADEMARK OFFICE
CERTIFICATE OF CORRECTION

| | | |
|---|---|---|
| PATENT NO. | : 7,804,932 B2 | |
| APPLICATION NO. | : 12/254000 | |
| DATED | : September 28, 2010 | |
| INVENTOR(S) | : Lior Kravitz | |

It is certified that error appears in the above-identified patent and that said Letters Patent is hereby corrected as shown below:

On Title page, in Item (57), under "ABSTRACT", in column 2, line 2, after "in" delete "a".

Signed and Sealed this
Fourth Day of January, 2011

David J. Kappos
*Director of the United States Patent and Trademark Office*